United States Patent
Kim et al.

(10) Patent No.: US 9,166,199 B2
(45) Date of Patent: Oct. 20, 2015

(54) ORGANIC ELECTROLUMINESCENCE DEVICE

(71) Applicant: Samsung Display Co., Ltd., Yongin, Gyeonggi-Do (KR)

(72) Inventors: Jeong Hwan Kim, Cheonan-si (KR); Joo Sun Yoon, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/019,203

(22) Filed: Sep. 5, 2013

(65) Prior Publication Data

US 2014/0145159 A1    May 29, 2014

(30) Foreign Application Priority Data

Nov. 29, 2012   (KR) ................. 10-2012-0137234

(51) Int. Cl.
*H01L 51/00* (2006.01)
*H01L 51/52* (2006.01)
*H01L 27/32* (2006.01)

(52) U.S. Cl.
CPC .......... *H01L 51/5284* (2013.01); *H01L 27/322* (2013.01)

(58) Field of Classification Search
CPC ............ H01L 51/5278; H01L 51/5284; H01L 27/322

USPC .............................................. 257/40, 59, 72
See application file for complete search history.

(56) References Cited

U.S. PATENT DOCUMENTS

| | | | |
|---|---|---|---|
| 7,375,464 B2 | 5/2008 | Chin et al. | |
| 7,940,001 B2 | 5/2011 | Park et al. | |
| 8,087,964 B2 | 1/2012 | Yang et al. | |
| 2002/0047120 A1* | 4/2002 | Inukai | 257/59 |
| 2006/0152151 A1 | 7/2006 | Seo | |
| 2008/0036367 A1* | 2/2008 | Eida et al. | 313/504 |
| 2010/0072880 A1* | 3/2010 | Adachi et al. | 313/498 |
| 2011/0108845 A1 | 5/2011 | Kwon et al. | |
| 2011/0248968 A1 | 10/2011 | Suh | |
| 2012/0187394 A1* | 7/2012 | Hatano et al. | 257/43 |

FOREIGN PATENT DOCUMENTS

| | | | |
|---|---|---|---|
| KR | 10-2010-0041314 A | 4/2010 | |
| KR | 10-2012-0042438 A | 5/2012 | |
| KR | 10-2012-0042549 A | 5/2012 | |
| KR | 10-2012-0045470 A | 5/2012 | |

* cited by examiner

*Primary Examiner* — Tu-Tu Ho
(74) *Attorney, Agent, or Firm* — Robert E. Bushnell, Esq.

(57) ABSTRACT

An organic electroluminescence device comprises a plurality of Pixel Defining Layers (PDLs) formed on a substrate, first electrodes formed in a space that is defined by the substrate and the PDLs, white light emitting layers formed in a space that is defined by the first electrodes and the PDLs, a second electrode formed on the white light emitting layers, first black matrices formed on the second electrode, and a color filter layer located adjacent to the first black matrices and spaced apart from the first black matrices.

22 Claims, 9 Drawing Sheets

ORGANIC ELECTROLUMINESCENCE DEVICE

CLAIM OF PRIORITY

This application makes reference to, incorporates into this specification the entire contents of, and claims all benefits accruing under 35 U.S.C. §119 from an application earlier filed in the Korean Intellectual Property Office filed on Nov. 29, 2012 and there duly assigned Serial No. 10-2012-0137234

BACKGROUND OF THE INVENTION

1. Field of the Invention

The present invention relates to an organic electroluminescence device, and more particularly to an organic electroluminescence device which prevents color mixture while minimizing black matrices.

2. Description of the Prior Art

Recently, with the rapid development of display fields, various types of flat display devices having superior functions of lightweight, thin-filming, and low power consumption have been developed to substitute for existing cathode ray tubes (CRTs).

Examples of such flat display devices may include a liquid crystal display device (LCD), a plasma display panel device (PDP), a field emission display device (FED), and an organic electroluminescence device. Among them, the organic electroluminescence device is being watched on the point that it is compact and can display clear colors without requiring a separate light source.

SUMMARY OF THE INVENTION

A white organic electroluminescence device emits white light using color filters, and color mixture may occur as emitted light of a pixel region passes through a neighboring color filter. To cope with this, black matrices are installed on a color filter interface, but opening permeability is reduced due to such black matrices.

Accordingly, one subject to be solved by the present invention is to provide an organic electroluminescence device which can prevent color mixture while minimizing black matrices.

Additional advantages, subjects, and features of the invention will be set forth in part in the description which follows, and in part will become apparent to those having ordinary skill in the art upon examination of the following or may be learned from practice of the invention.

According to an aspect of the present invention, there is provided an organic electroluminescence device comprising a plurality of Pixel Defining Layers (PDLs) formed on a substrate, first electrodes formed in a space that is defined by the substrate and the PDLs, white light emitting layers formed in a space that is defined by the first electrodes and the PDLs, a second electrode formed on the white light emitting layers, first black matrices formed on the second electrode, and a color filter layer located on the first black matrices so to be spaced apart from the first black matrices.

According to another aspect of the present invention, there is provided an organic electroluminescence device comprising a plurality of Pixel Defining Layers (PDLs) formed on a substrate, first electrodes formed in a space that is defined by the substrate and the PDLs, white light emitting layers formed in a space that is defined by the first electrodes and the PDLs, a second electrode formed on the white light emitting layers, first black matrices formed on a lower portion of the substrate, and a color filter layer located on lower portions of the first black matrices so as to be spaced apart from the lower portions of the first black matrices.

According to still another aspect of the present invention, there is provided an organic electroluminescence device comprising a plurality of Pixel Defining Layers (PDLs) formed on a substrate, first electrodes formed in a space that is defined by the substrate and the PDLs, white light emitting layers formed in a space that is defined by the first electrodes and the PDLs, a second electrode formed on the white light emitting layers, first black matrices formed on the second electrode, and a color filter layer located on the first black matrices so as to be spaced apart from the first black matrices. The first black matrices cross straight lines connected between center points of non-adjacent side surfaces of the two adjacent white light emitting layers, between which the PDLs located so as to correspond to the first black matrix in a vertical direction is disposed, and lower points of interfaces of the color filters being located on upper portions of the first black matrices in the vertical direction.

According to the embodiments of the present invention, at least the following effect can be achieved. By minimizing the black matrices, the color mixture can be prevented from occurring while the opening permeability is maximized. The effects according to the present invention are not limited to the contents as exemplified above, but further various effects are included in the description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements throughout various figures.

Although the terms "first", "second", and so forth are used to describe diverse constituent elements, such constituent elements are not limited by the terms. The terms are used only to discriminate a constituent element from other constituent elements. Accordingly, in the following description, a first constituent element may be a second constituent element.

Figure 1A:
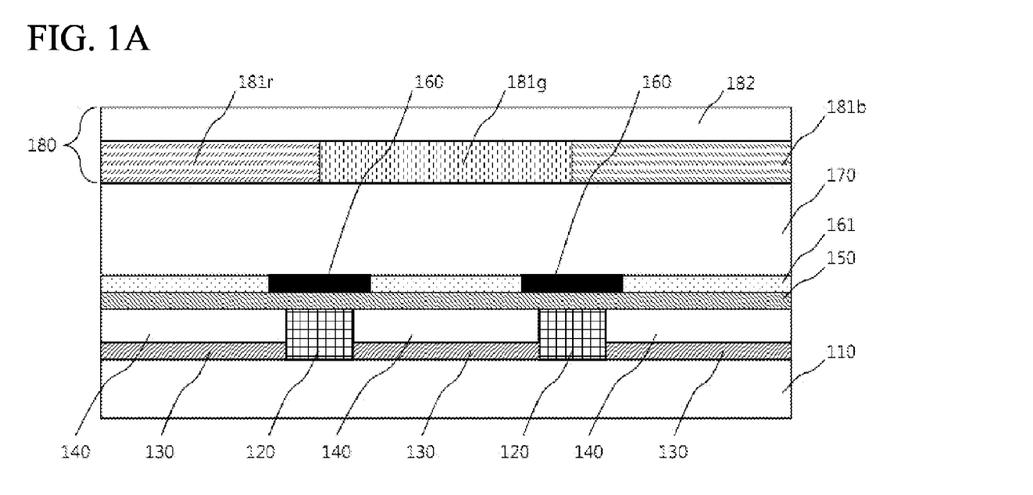
FIG. 1A is a schematic cross-sectional view of an organic electroluminescence device according to an embodiment of the present invention.
Figure 1B:
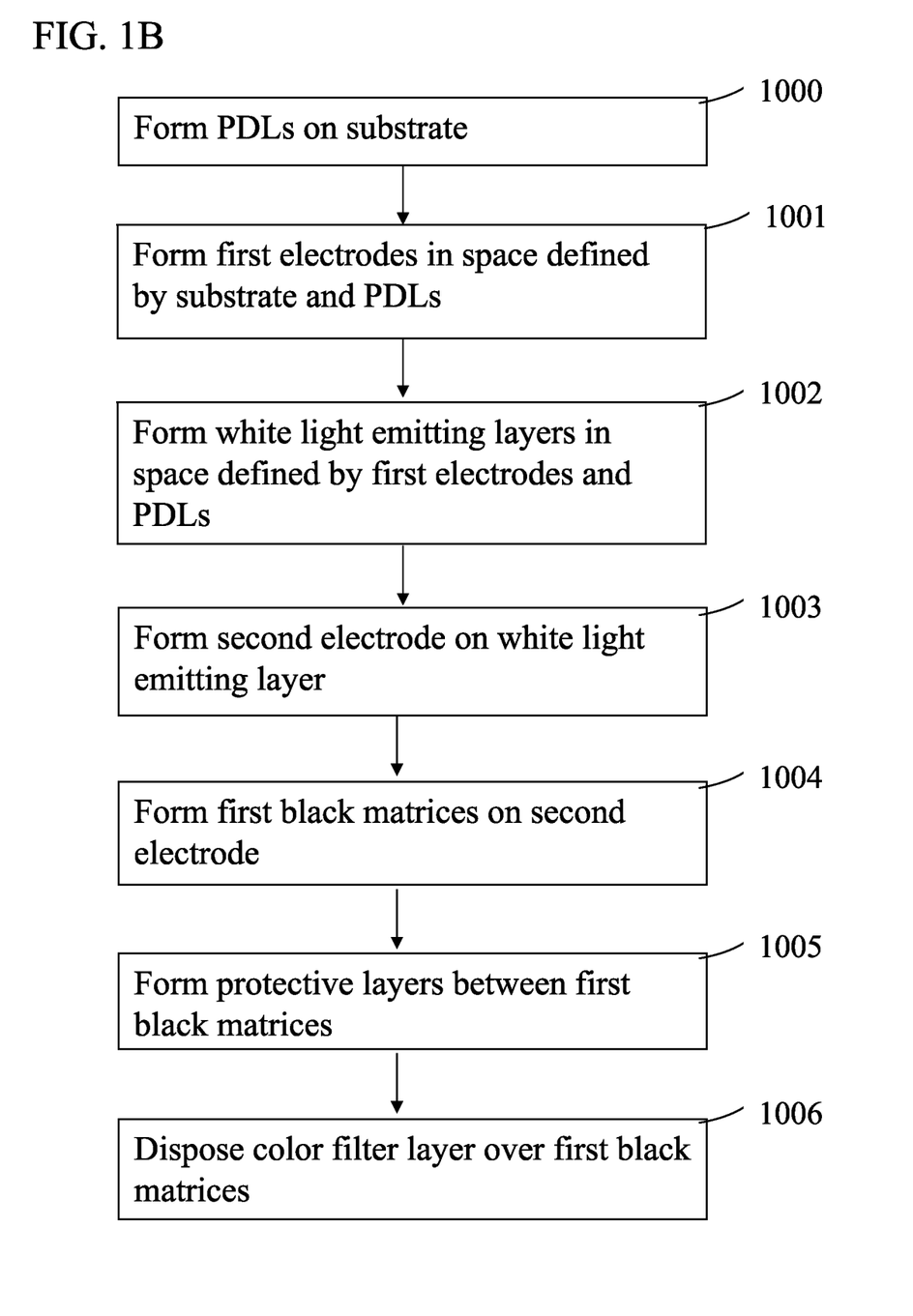
FIG. 1B is a flow chart illustrating the fabrication thereof.

Hereinafter, an organic electroluminescence device according to an embodiment of the present invention will be described with reference to FIG. 1A, which is a schematic cross-sectional view of an organic electroluminescence device according to an embodiment of the present invention, and FIG. 1B is a flow chart illustrating the fabrication thereof.

As illustrated in FIG. 1A, the organic electroluminescence device includes a lower substrate 110, Pixel Defining Layers (PDLs) 120 formed on the lower substrate 110, first electrodes 130 formed in a space that is defined by the lower substrate 110 and the PDLs 120, white light emitting layers 140 formed on the first electrodes 130 in a space that is defined by the first electrodes 130 and the PDLs 120, a second electrode 150 formed on the white light emitting layers 140, first black matrices 160 formed on the second electrode 150, protective layers 161 located between the first black matrices 160, and a color filter layer 180 located on the first black matrices 160 so as to be spaced apart from the first black matrices 160.

Preferably, for insulation between the first electrodes 130, the lower substrate 110 may be an insulating substrate. Furthermore, the lower substrate 110 may be made of a transparent material, or may be made of a reflective material so as to reflect light in a direction of the color filter layer 180.

On the lower substrate 110, PDLs 120 that define pixel regions are formed (FIG. 1B, step 1000). The PDLs 120 may be made of, for example, a material which light cannot penetrate, or may have a multilayer structure including layers made of such a material.

The first electrodes 130 are formed on the lower substrate 110 in the respective pixel regions that are divided by the PDLs 120 (FIG. 1B, step 1001). Any material which has conductivity, and which can be used as the electrode, can be used as the first electrode 130 with no limits. According to circumstances, the first electrode 130 may be a transparent electrode, and the light which has passed through the first electrode 130 may be reflected by the lower substrate 110 and then be emitted in the direction of the color filter layer 180. Furthermore, the first electrode 130 may be a reflective electrode, and the light emitted from the white light emitting layer 140 may be reflected by the first electrode and may then be emitted in the direction of the color filter layer 180. The material that is used as the transparent electrode may be, for example, ITO or IZO. As one example, the first electrode 130 may be an anode.

The white light emitting layers 140 are formed between the first electrodes 130 and the second electrode 150 in the respective pixel regions that are divided by the PDLs 120 (FIG. 1B, step 1002). The white light emitting layer 140 includes a stack (not illustrated) which includes a hole transfer layer, a hole transport layer, a light emitting layer, an electron transport layer, and an electron injection layer. The white light emitting layer 140 may include one or more stacks. The stack may include one or more light emitting layers disposed therein. The light emitting layer disposed in the stack may emit white light itself, or may emit color lights except for the white light. In the case of emitting color lights except for the white color, the light emitting layer may be composed of a combination of the color lights which are mixed to form the white light.

The second electrode 150 is formed on the white light emitting layers 140 (FIG. 1B, step 1003). The second electrode 150 may be commonly formed, for example, on the pixel regions and the PDLs. In the same manner as the first electrode 130, any material which has conductivity, and which can be used as the electrode, can be used as the second electrode 150 with no limits. However, since the second electrode 150 is located in a path through which light emitted from the white light emitting layer 140 passes, it is preferable that the second electrode 150 be composed of a transparent electrode. The material that is used as the transparent electrode may be, for example, ITO or IZO. As one example, the second electrode 150 may be a cathode.

The first black matrices 160 are formed on the second electrode 150 in positions that correspond to the PDLs 120 in the vertical direction (FIG. 1B, step 1004). The first black matrices 160 are formed so as to prevent the light emitted from one pixel region from being emitted to a color filter of the adjacent pixel region. If the first black matrices 160 are formed on the pixel region, a photon emission area is physically reduced, and thus it is preferable that the first black matrices 160 are formed in the positions corresponding to the PDLs 120 in the vertical direction.

According to the organic electroluminescence device in the related art, a black matrix layer is formed on respective color filter interfaces of the color filter layer. In this case, in order to prevent the light emitted from one pixel region from being emitted to a color filter of the adjacent pixel region, it is necessary to provide black matrices having a wide area. As the area of the black matrices is increased, the photon emission area, that is, the opening permeability, becomes reduced, and the luminance of the organic electroluminescence device is deteriorated.

The protective layers 161 that protect the second electrode 150 may be formed in a space between the first black matrices 160 (FIG. 1B, step 1005). The protective layers 161 may be configured to cover the surface of the second electrode in the space between the first black matrices 160, or may be configured to cover both the second electrode 150 and the first black matrices 160. Although there are no special limits on the material of the protective layer 161, it is preferable that the protective layer 161 be made of a transparent material since the protective layer 161 is located in the path through which the light emitted from the white light emitting layer 140 passes.

The color filter layer 180 is formed on the first black matrices 160 so as to be spaced apart from the first black matrices 160 (FIG. 1B, step 1006). The space between the color filter layer 180 and the first black matrices 160 may be filled with air or a filler 170. The color filter layer 180 includes one selected from red (R), green (G), and blue (B) color filters in a position that corresponds to each pixel region in the vertical direction, and color filters having different colors are adjacent to each other. Preferably, the color filter layer may include red (181r), green (181g), and blue (181b) color filters which are sequentially arranged. The interfaces of the color filters 181r, 181g, and 181b are formed in positions that correspond to the PDLs 120 and the first black matrices 160 in the vertical direction. The color filter layer 180 may include an upper substrate 182 disposed on the color filters 181r, 181g, and 181b.

For example, in the case where the pixel region that corresponds to the green color filter 181g emits light so as to display only the green color, and the emitted light permeates the adjacent red (181r) or green (181b) color filter, color mixture occurs so as to cause a color in which the red, green, and blue colors are mixed to be expressed on a display.

According to the present invention, this problem is solved through a structure which can shield the light emitted to the adjacent color filter while minimizing the area of the first black matrices.

Figure 2A:
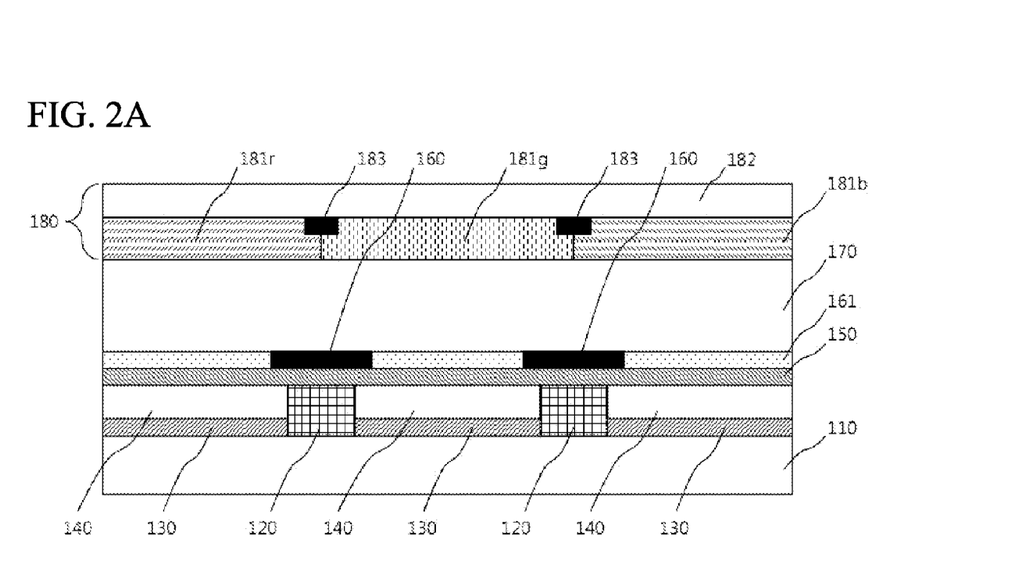
FIG. 2A is a schematic cross-sectional view of one modified example of the organic electroluminescence device of FIG. 1.
Figure 2B:
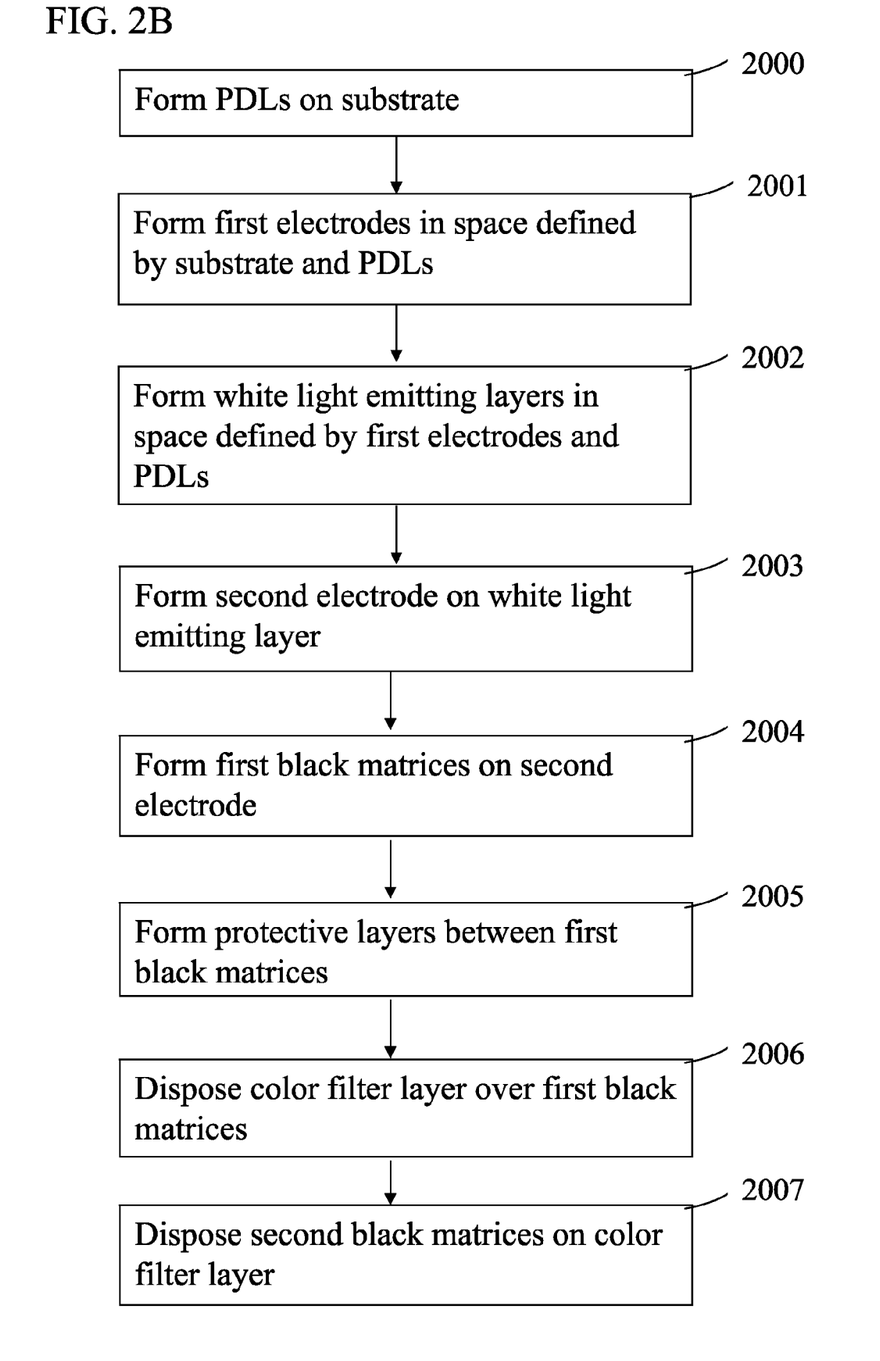
FIG. 2B is a flow chart illustrating the fabrication thereof.

FIG. 2A is a schematic cross-sectional view of one modified example of the organic electroluminescence device of FIG. 1A, and FIG. 2B is a flow chart illustrating the fabrication thereof. The organic electroluminescence device of FIG. 2A is configured to additionally include second black matrices 183 disposed on the color filter layer 180 of FIG. 2A (corresponding to the color filter layer 80 of FIG. 1A). Thus, steps 2000-2006 of the flow chart of FIG. 2B are identical to steps 1000-1006 of the flow chart of FIG. 1B but the additional step 2007, relating to disposition of second black matrices 183 on the color filter layer 180, has been added.

The second black matrices 183 serve to shield the light which is not shielded by the first black matrices 160 but which is emitted to the adjacent color filter. For this, the second black matrices 183 may be formed on the interfaces between the color filters 181r, 181g, and 181b.

The width of the second black matrices 183 is smaller than the width of the first black matrices 160. As the width of the second black matrices 183 becomes larger, the permeation region of the color filters 181r, 181g, and 181b becomes smaller, and thus the opening permeability is reduced. Accordingly, it is preferable that the width of the second black matrices be minimized.

Figure 3A:
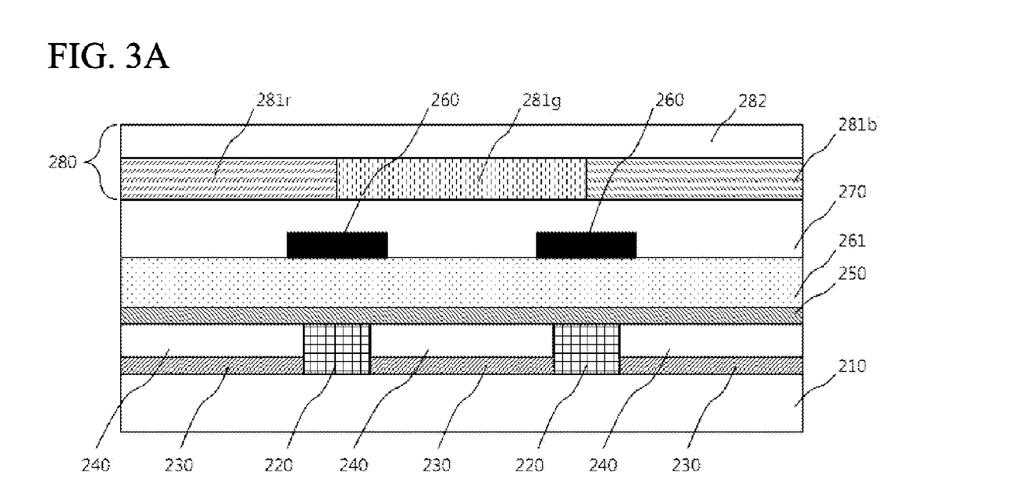
FIG. 3A is a schematic cross-sectional view of an organic electroluminescence device according to another embodiment of the present invention.
Figure 3B:
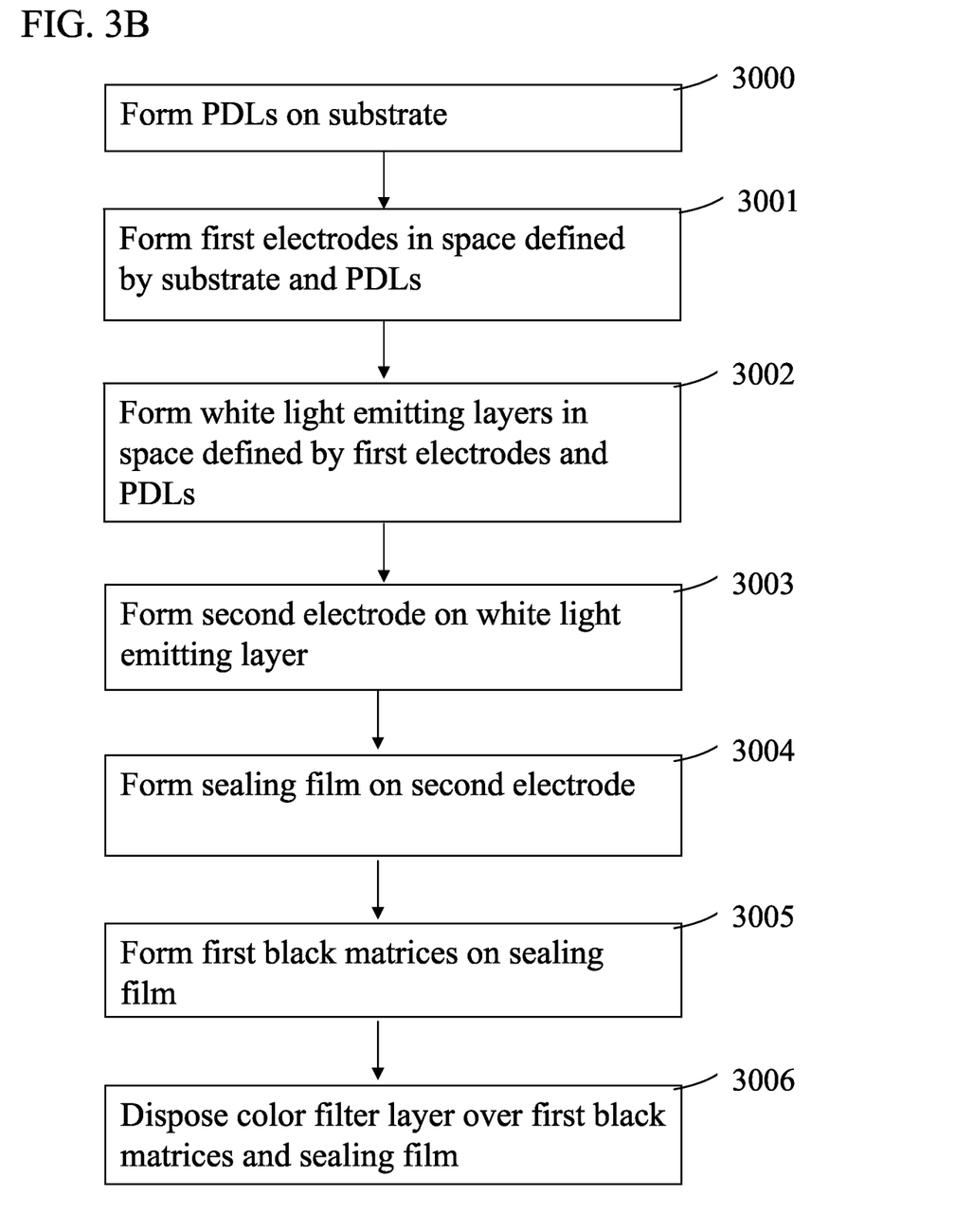
FIG. 3B is a flow chart illustrating the fabrication thereof.

FIG. 3A is a schematic cross-sectional view of an organic electroluminescence device according to another embodiment of the present invention, and FIG. 3B is a flow chart illustrating the fabrication thereof.

As illustrated in FIG. 3A, the organic electroluminescence device includes a lower substrate 210, PDLs 220 formed on the lower substrate 210 (FIG. 3B, step 3000), first electrodes 230 formed in a space that is defined by the lower substrate 210 and the PDLs 220 (FIG. 3B, step 3001), white light emitting layers 240 formed on the first electrodes 230 in a space that is defined by the first electrodes 230 and the PDLs 220 (FIG. 3B, step 3002), a second electrode 250 formed on the white light emitting layers 240 (FIG. 3B, step 3003), a sealing film 261 formed on the second electrode 250 (FIG. 3B, step 3004), first black matrices 260 formed on the sealing film 261 (FIG. 3B, step 3005), and a color filter layer 280 located on the first black matrices 260 and the sealing film 261 so as to be spaced apart from the first black matrices 160 and the sealing film 261 (FIG. 3B, step 3006).

Since the contents from the lower substrate 210 to the second electrode 250 are the same as those illustrated in FIG. 1, the explanation thereof will be omitted.

On the second electrode 250, the sealing film 261 is formed so as to cover the second electrode 250. There are no special limits on the material of the sealing film 261, and the sealing film 261 may be formed as a sealing substrate rather than in a film shape. Since the sealing film 261 is located in the path through which the light emitted from the white light emitting layer 140 passes, it is preferable that the sealing film 261 be made of a transparent material.

In order to shield the emission of the light to the adjacent color filter while maximally maintaining the opening permeability, the first black matrices 260 are formed on the sealing film 261 in positions that correspond to the PDLs 220 in the vertical direction.

Since the color filter layer 280 is the same as that illustrated in FIG. 1, the explanation thereof will be omitted.

Figure 4A:
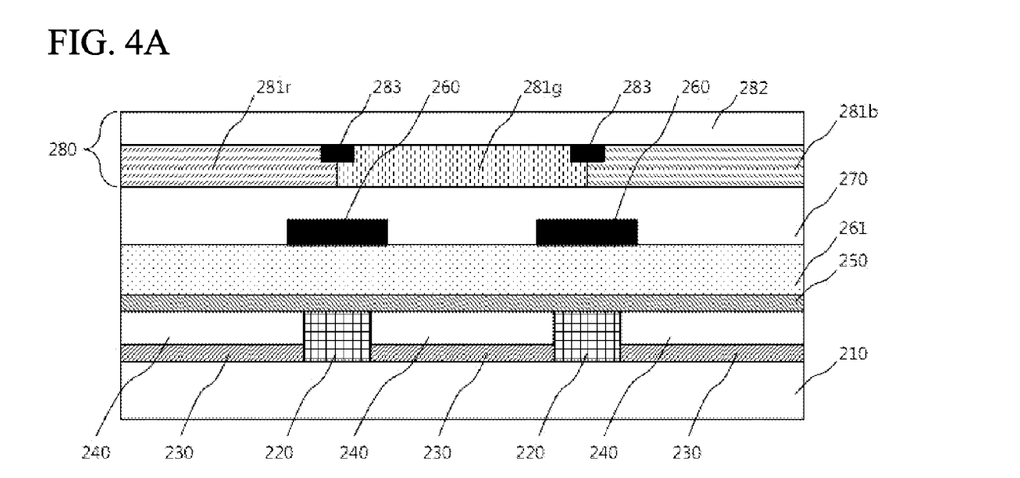
FIG. 4A is a schematic cross-sectional view of one modified example of the organic electroluminescence device of FIG. 3.
Figure 4B:
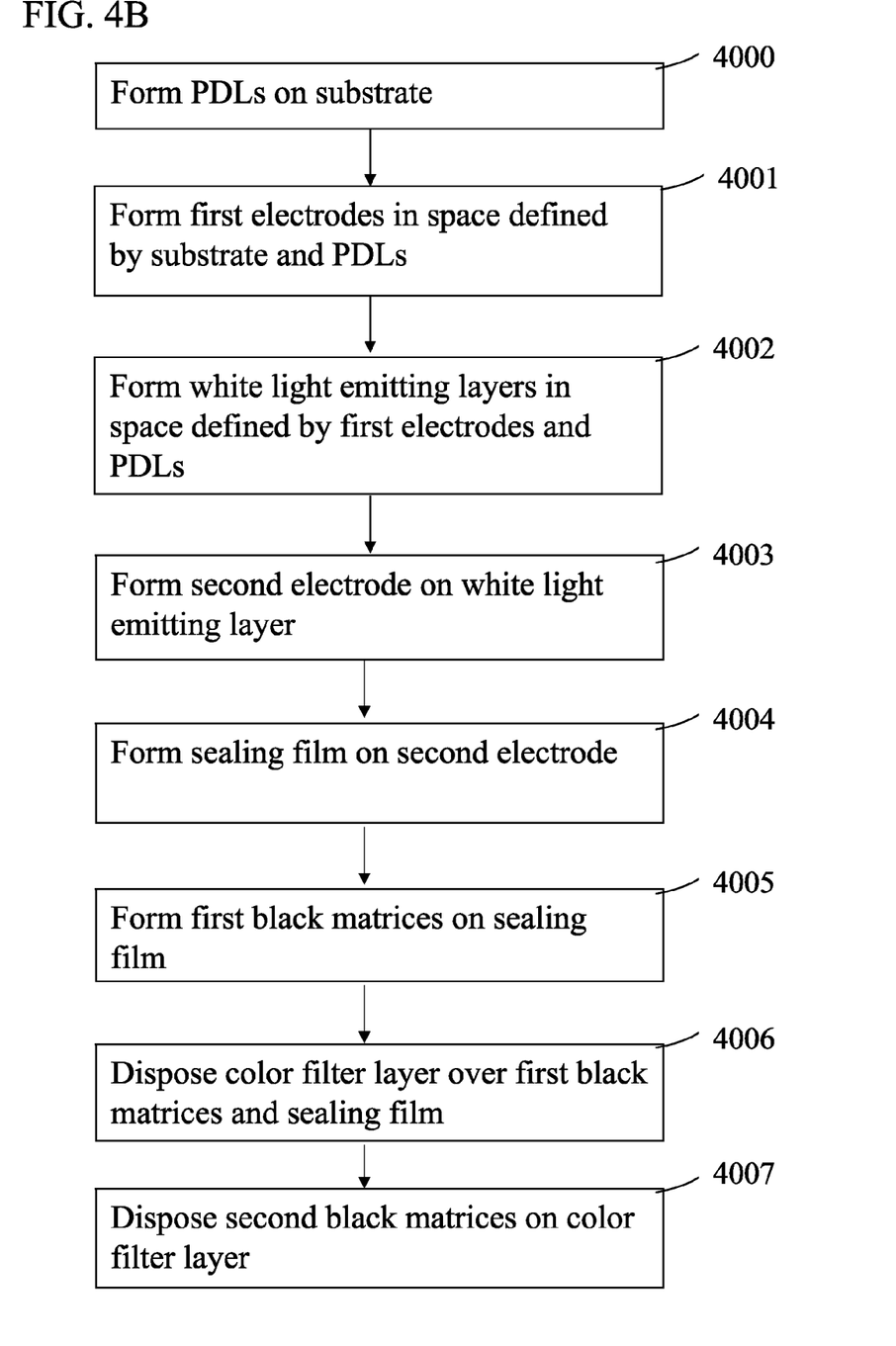
FIG. 4B is a flow chart illustrating the fabrication thereof.

FIG. 4A is a schematic cross-sectional view of one modified example of the organic electroluminescence device of FIG. 3A, and FIG. 4B is a flow chart illustrating the fabrication thereof. The organic electroluminescence device of FIG. 4A is configured to additionally include second black matrices 283 disposed on the color filter layer 280 of the structure of the organic electroluminescence device of FIG. 3A.

Since the configuration and explanation of the second black matrices 283 are the same as those illustrated in FIG. 2A, the explanation thereof will be omitted. In addition, steps 4000-4003 of the flow chart of FIG. 4B are identical to steps 2000-2003 of FIG. 2B, but steps 4004-4007 of FIG. 4B have replaced steps 2004-2007 of FIG. 2B.

Figure 5A:
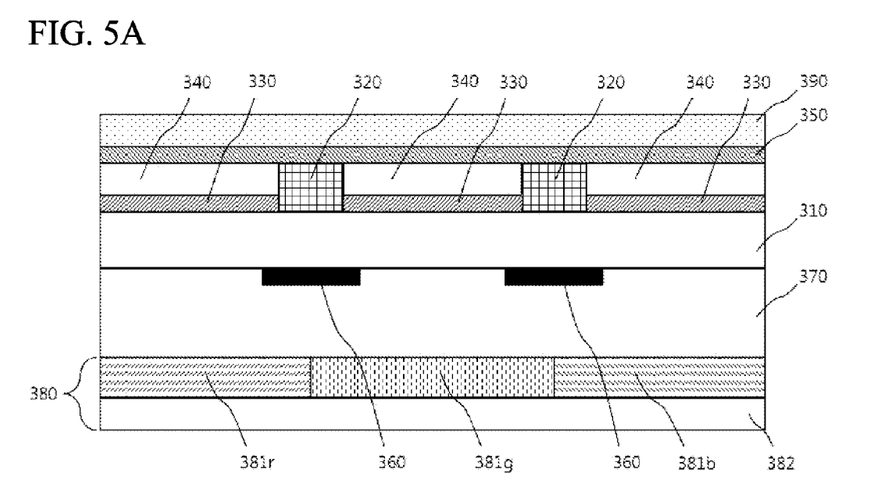
FIG. 5A is a schematic cross-sectional view of an organic electroluminescence device according to still another embodiment of the present invention.
Figure 5B:
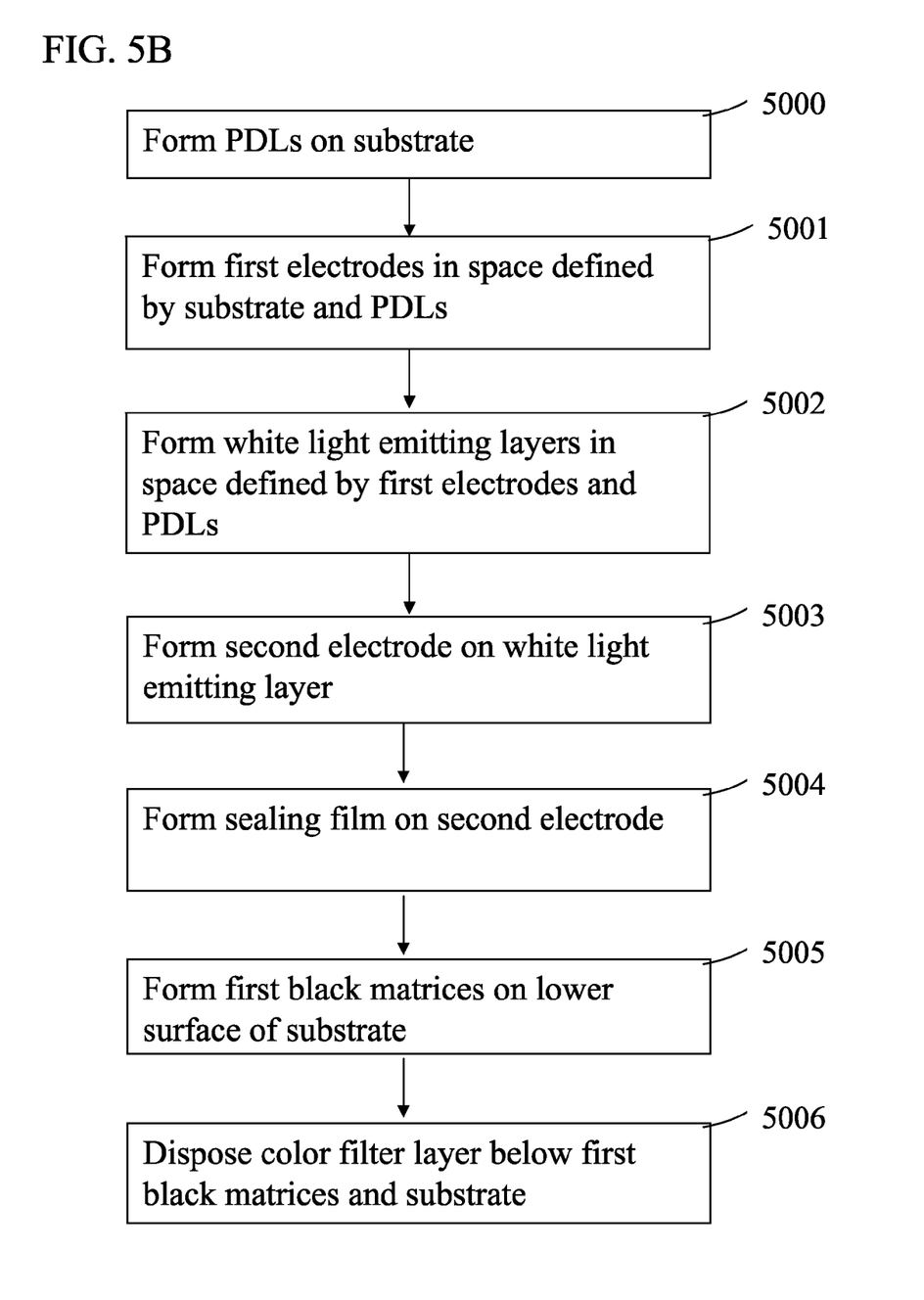
FIG. 5B is a flow chart illustrating the fabrication thereof.

FIG. 5A is a schematic cross-sectional view of an organic electroluminescence device according to still another embodiment of the present invention, and FIG. 5B is a flow chart illustrating the fabrication thereof.

As illustrated in FIG. 5A, the organic electroluminescence device includes a substrate 310, PDLs 320 formed on the substrate 310, first electrodes 330 formed in a space that is defined by the substrate 310 and the PDLs 320, white light emitting layers 340 formed on the first electrodes 330 in a space that is defined by the first electrodes 330 and the PDLs 320, a second electrode 350 formed on the white light emitting layers 340, a sealing film 390 formed on the second electrode 350, first black matrices 360 formed on a lower surface of the substrate 310, and a color filter layer 380 located below the first black matrices 360 and the substrate 310 so as to be spaced apart from the first black matrices 360 and the substrate 310.

The above-described configuration is equivalent to the configuration illustrated in FIG. 1A except that the first black matrices 360 are located on the lower surface of the substrate 310 and the color filter layer 380 is formed so as to be spaced apart from the first black matrices 360 and the substrate 310. Thus, steps 5000-5003 of FIG. 5B are identical to steps 1000-1003 of FIG. 1B, but steps 5004-5006 of FIG. 5B have replaced steps 1004-1006 of FIG. 1B.

According to the above-described structure, the first electrodes 330 are located in the path through which light emitted from the white light emitting layer 340 passes, and thus it is preferable that the first electrode 330 be composed of a transparent electrode. By contrast, the second electrode 350 may be composed of a transparent electrode or a reflective electrode, and in the case where the second electrode 350 is a transparent electrode, the light that has passed through the second electrode 350 may be reflected by the sealing film and may be emitted in the direction of the color filter layer 380. In this case, the sealing film is formed of a reflective material.

Figure 6A:
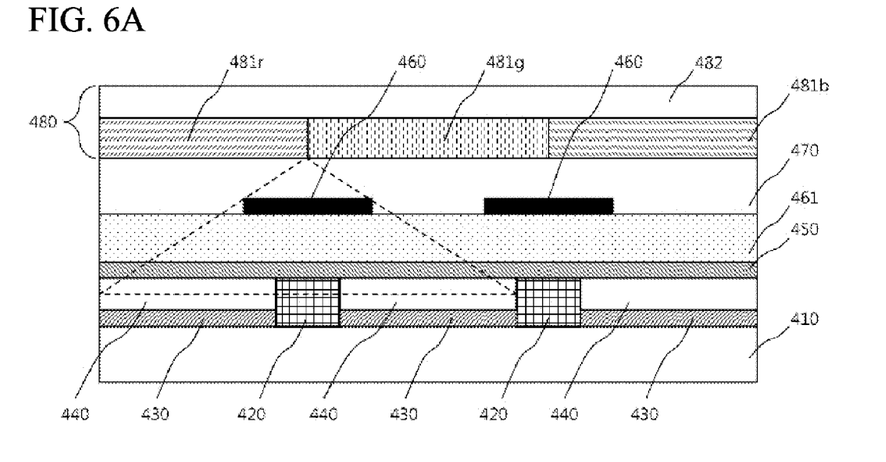
FIG. 6A is a schematic cross-sectional view of an organic electroluminescence device according to yet still another embodiment of the present invention.
Figure 6B:
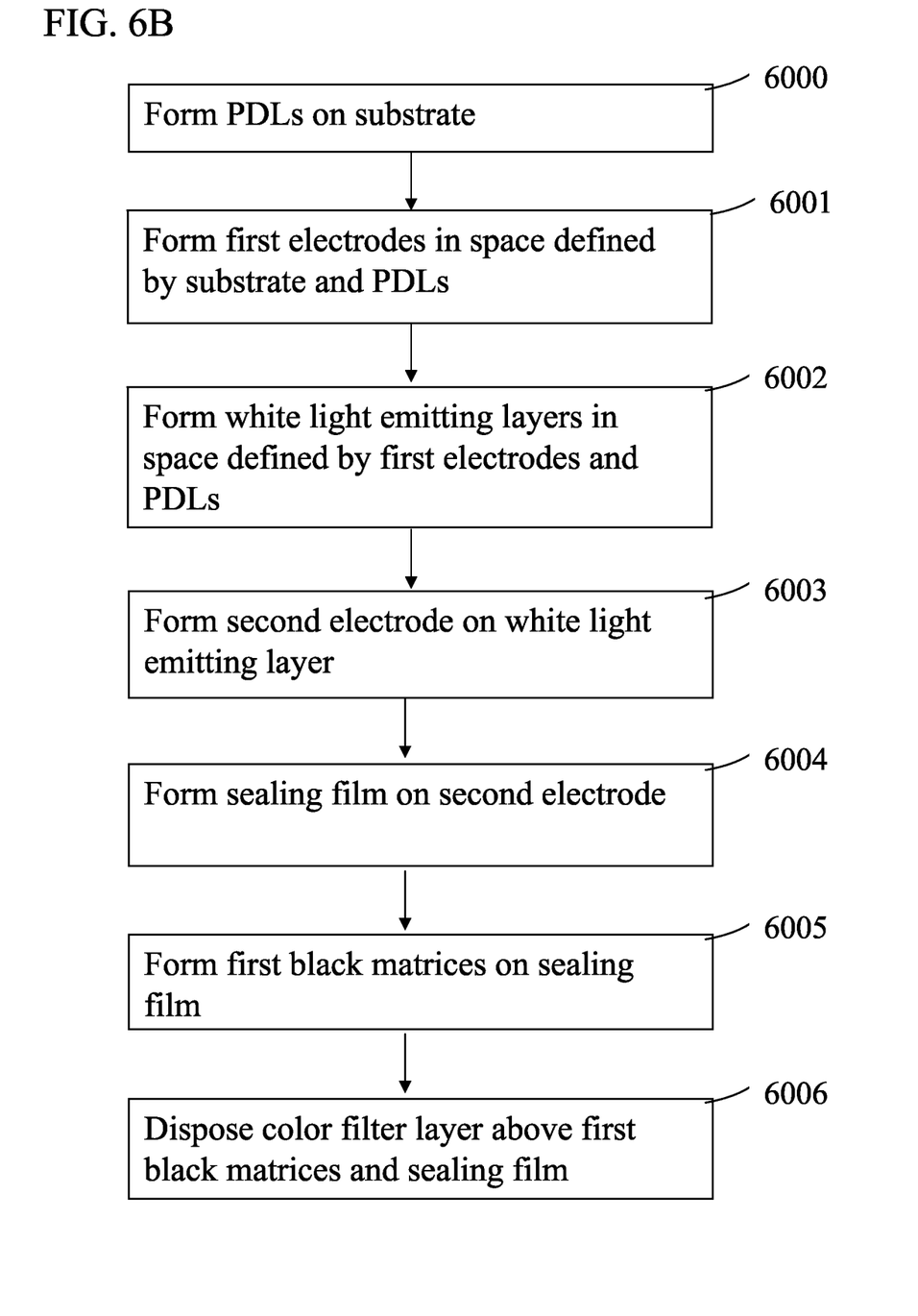
FIG. 6B is a flow chart illustrating the fabrication thereof.

FIG. 6A is a schematic cross-sectional view of an organic electroluminescence device according to yet still another embodiment of the present invention, and FIG. 6B is a flow chart illustrating the fabrication thereof.

As illustrated in FIG. 6A, the organic electroluminescence device includes a lower substrate 410, PDLs 420 formed on the lower substrate 410 (step 6000 of FIG. 6B), first electrodes 430 formed in a space that is defined by the lower substrate 410 and the PDLs 420 (step 6001 of FIG. 6B), white light emitting layers 440 formed on the first electrodes 430 in a space that is defined by the first electrodes 430 and the PDLs 420 (step 6002 of FIG. 6B), a second electrode 450 formed on the white light emitting layers 440 (step 6003 of FIG. 6B), a sealing film 461 formed on the second electrode 450 (step 6004 of FIG. 6B), first black matrices 460 formed on the sealing film 461 (step 6005 of FIG. 6B), and a color filter layer 480 located on the first black matrices 460 and the sealing film 461 so as to be spaced apart from the first black matrices 460 and the sealing film 461 (step 6006 of FIG. 6B).

The first black matrices 460 cross straight lines (see dotted triangle in FIG. 6A) connected between center points of non-adjacent side surfaces of the two adjacent white light emitting layers 440, between which the PDL 420, located so as to correspond to the first black matrix 460 in the vertical direction, is disposed, and lower points of interfaces of the color filters 481r, 481g, and 481b located on upper portions of the first black matrices in the vertical direction.

Although not illustrated, in the case where the first black matrices 460 do not cross the straight lines, second black matrices may be additionally included in the color filter layer 480 so as to prevent the color mixture.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An organic electroluminescence device, comprising:
a plurality of Pixel Defining Layers (PDLs) formed on a substrate;
first electrodes formed in a space that is defined by the substrate and the PDLs;
white light emitting layers formed in a space that is defined by the first electrodes and the PDLs;
a second electrode formed on the white light emitting layers;
first black matrices formed on the second electrode; and
a color filter layer located on the first black matrices and spaced apart from the first black matrices,
the first black matrices are disposed between the color filter layer and the second electrode.

2. The organic electroluminescence device of claim 1, the first black matrices being formed in positions that correspond to the PDLs in a vertical direction.

3. The organic electroluminescence device of claim 1, further comprising one of a sealing film and a sealing substrate, said one of the sealing film and the sealing substrate being formed between the second electrode and the first black matrices.

4. The organic electroluminescence device of claim 1, the space between the color filter layer and the first black matrices being filled with one of air and a filler.

5. The organic electroluminescence device of claim 1, the color filter layer including one selected from red (R), green (G), and blue (B) color filters in a position that corresponds to the white light emitting layer in a vertical direction.

6. The organic electroluminescence device of claim 5, the red, green, and blue color filters being sequentially arranged in the color filter layer.

7. The organic electroluminescence device of claim 6, interfaces of the red, green, and blue color filters being formed in positions that correspond to the PDLs and the first black matrices in a vertical direction.

8. The organic electroluminescence device of claim 5, the color filter layer further comprising second black matrices.

9. The organic electroluminescence device of claim 8, the second black matrices being formed on interfaces of the red, green, and blue color filters.

10. The organic electroluminescence device of claim 8, a width of the second black matrix being smaller than a width of the first black matrix.

11. An organic electroluminescence device, comprising:
a plurality of Pixel Defining Layers (PDLs) formed on upper portion of a substrate;
first electrodes formed in a space that is defined by the substrate and the PDLs;
white light emitting layers formed in a space that is defined by the first electrodes and the PDLs;
a second electrode formed on the white light emitting layers;
first black matrices formed on a lower portion of the substrate; and
a color filter layer located on lower portions of the first black matrices and spaced apart from the lower portions of the first black matrices,
the first black matrices are sandwiched between the color filter layer and the substrate.

12. The organic electroluminescence device of claim 11, the first black matrices being formed in positions that correspond to the PDLs in a vertical direction.

13. The organic electroluminescence device of claim 11, a space between the color filter layer and the first black matrices being filled with one of air and a filler.

14. The organic electroluminescence device of claim 11, the color filter layer including one selected from red (R), green (G), and blue (B) color filters in a position that corresponds to the white light emitting layer in a vertical direction.

15. The organic electroluminescence device of claim 14, the red, green, and blue color filters being sequentially arranged in the color filter layer.

16. The organic electroluminescence device of claim 15, interfaces of the red, green, and blue color filters being formed in positions that correspond to the PDLs and the first black matrices in a vertical direction.

17. The organic electroluminescence device of claim 11, the substrate being a transparent substrate.

18. The organic electroluminescence device of claim 14, the color filter layer further comprising second black matrices.

19. The organic electroluminescence device of claim 18, the second black matrices being formed on interfaces of the red, green, and blue color filters.

20. The organic electroluminescence device of claim 18, a width of the second black matrix being smaller than a width of the first black matrix.

21. An organic electroluminescence device, comprising:
a plurality of Pixel Defining Layers (PDLs) formed on a substrate;
first electrodes formed in a space that is defined by the substrate and the PDLs;
white light emitting layers formed in a space that is defined by the first electrodes and the PDLs;

a second electrode formed on the white light emitting layers;

first black matrices formed on the second electrode; and a color filter layer located on the first black matrices and spaced apart from the first black matrices;

the first black matrices crossing straight lines connected between center points of non-adjacent side surfaces of two adjacent white light emitting layers, between which a PDL located so as to correspond to the first black matrix in a vertical direction, is disposed, and lower points of interfaces of the color filters located on upper portions of the first black matrices in the vertical direction.

22. The organic electroluminescence device of claim 21, outer surfaces of the first black matrices being in contact with the straight lines.

* * * * *